(12) United States Patent
Linden et al.

(10) Patent No.: US 6,201,701 B1
(45) Date of Patent: Mar. 13, 2001

(54) INTEGRATED SUBSTRATE WITH ENHANCED THERMAL CHARACTERISTICS

(75) Inventors: Rolf W. Linden, Leona Valley; Richard D. Fryhoff, Valencia; Larry R. Duncan, Cypress, all of CA (US)

(73) Assignee: Kimball International, Inc., Jasper, IN (US)

( * ) Notice: Subject to any disclaimer, the term of this patent is extended or adjusted under 35 U.S.C. 154(b) by 0 days.

(21) Appl. No.: 09/038,118

(22) Filed: Mar. 11, 1998

(Under 37 CFR 1.47)

(51) Int. Cl.⁷ ......................................................... H05K 7/20
(52) U.S. Cl. ............................................. 361/720; 174/252
(58) Field of Search ................................... 174/252, 255, 174/260; 361/704, 707, 712, 713, 719, 720, 760, 761, 764, 792, 793, 794, 780

(56) References Cited

U.S. PATENT DOCUMENTS

| | | | |
|---|---|---|---|
| 4,628,407 | 12/1986 | August et al. ......................... | 361/388 |
| 5,058,799 | 10/1991 | Zsamboky ............................. | 228/124 |
| 5,100,714 | 3/1992 | Zsamboky ............................. | 428/137 |
| 5,371,653 | * 12/1994 | Kametani et al. ................... | 361/721 |
| 5,375,039 | 12/1994 | Wiesa .................................. | 361/720 |
| 5,398,160 | 3/1995 | Umeda ................................. | 361/707 |
| 5,467,251 | 11/1995 | Katchmar ............................. | 361/719 |
| 5,513,072 | 4/1996 | Imaji et al. .......................... | 361/707 |
| 5,521,437 | 5/1996 | Oshima et al. ...................... | 257/701 |
| 5,574,630 | * 11/1996 | Kresge et al. ....................... | 361/794 |
| 5,590,030 | * 12/1996 | Kametani et al. ................... | 361/721 |
| 5,641,944 | 6/1997 | Wieloch et al. ..................... | 174/252 |
| 5,670,749 | 9/1997 | Wieloch et al. ..................... | 174/260 |
| 5,675,474 | * 10/1997 | Nagase et al. ....................... | 361/704 |

* cited by examiner

Primary Examiner—Gregory Thompson
(74) Attorney, Agent, or Firm—Baker & Daniels

(57) ABSTRACT

An integrated substrate comprising a heatsink base, and a multilayer circuit board bonded thereto, the multilayer circuit board having the capability to interconnect both power and control semiconductor elements and efficiently dissipate heat therefrom. A thermally conductive and electrically insulating bonding material having excellent thermal properties bonds the multilayer circuit board to the base. One or more thick electrically conductive foil patterns are formed intermediate the top surface of the circuit board and the heatsink base, the thick foil pattern(s) adapted to interconnect high power semiconductor elements. Also included intermediate the top surface of the circuit board and the heatsink base are one or more interconnect patterns which wire control semiconductor elements. An integrated substrate is provided that allows a compact density of control and power elements in one small module, yet the substrate exhibits improved thermal properties so that heat generated by power semiconductors connected to the substrate can be efficiently dissipated.

53 Claims, 7 Drawing Sheets

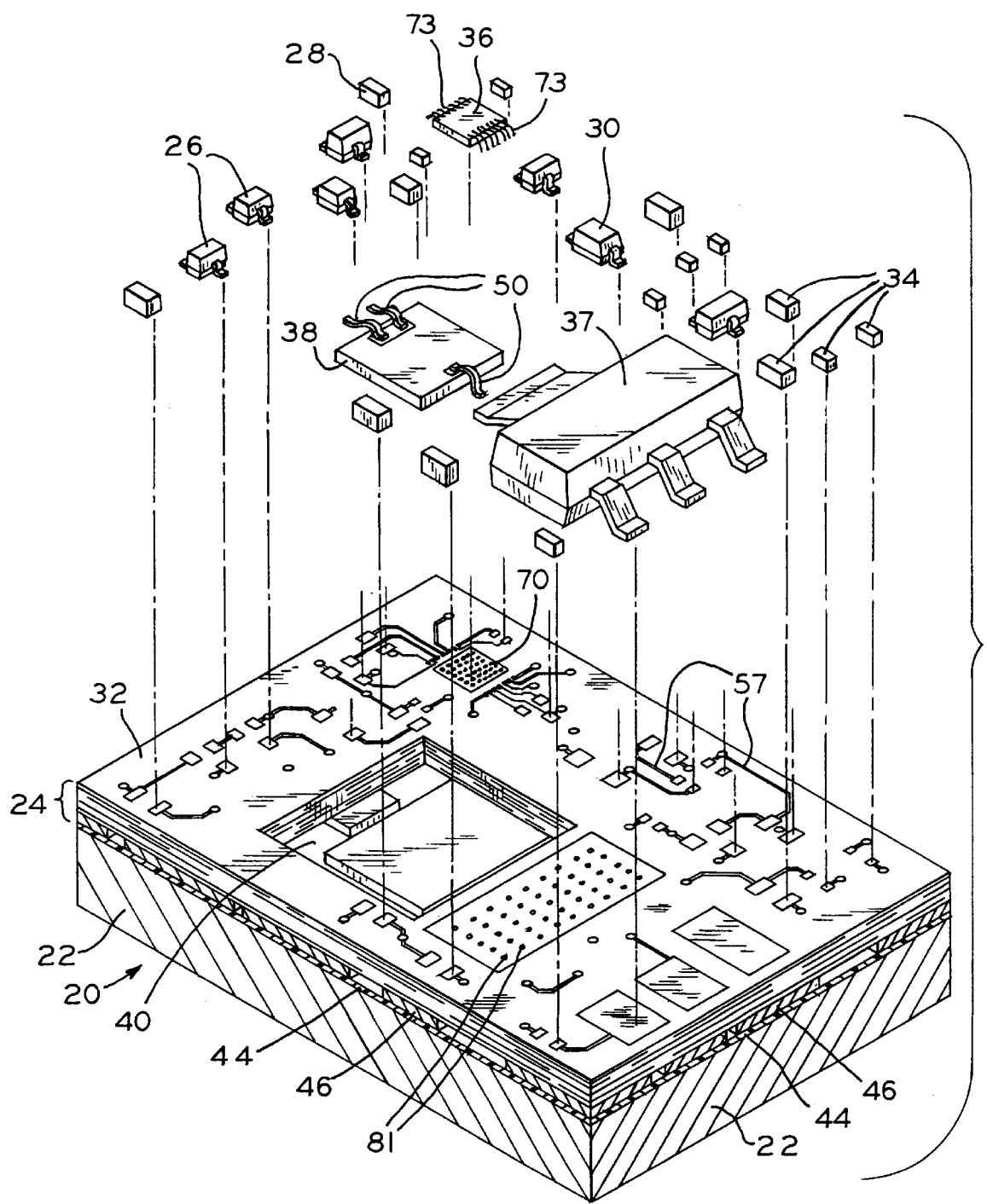
FIG_1

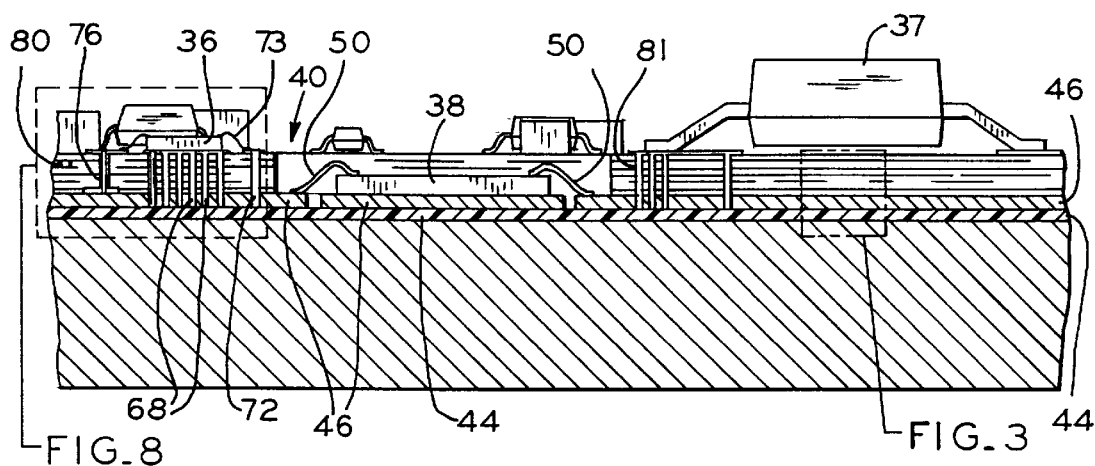
FIG_2
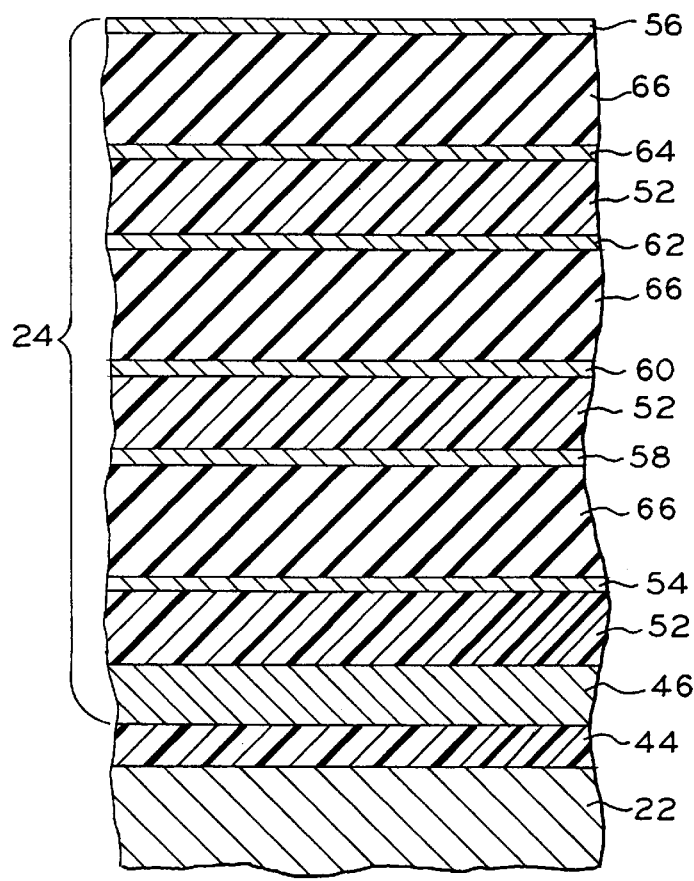
FIG_3

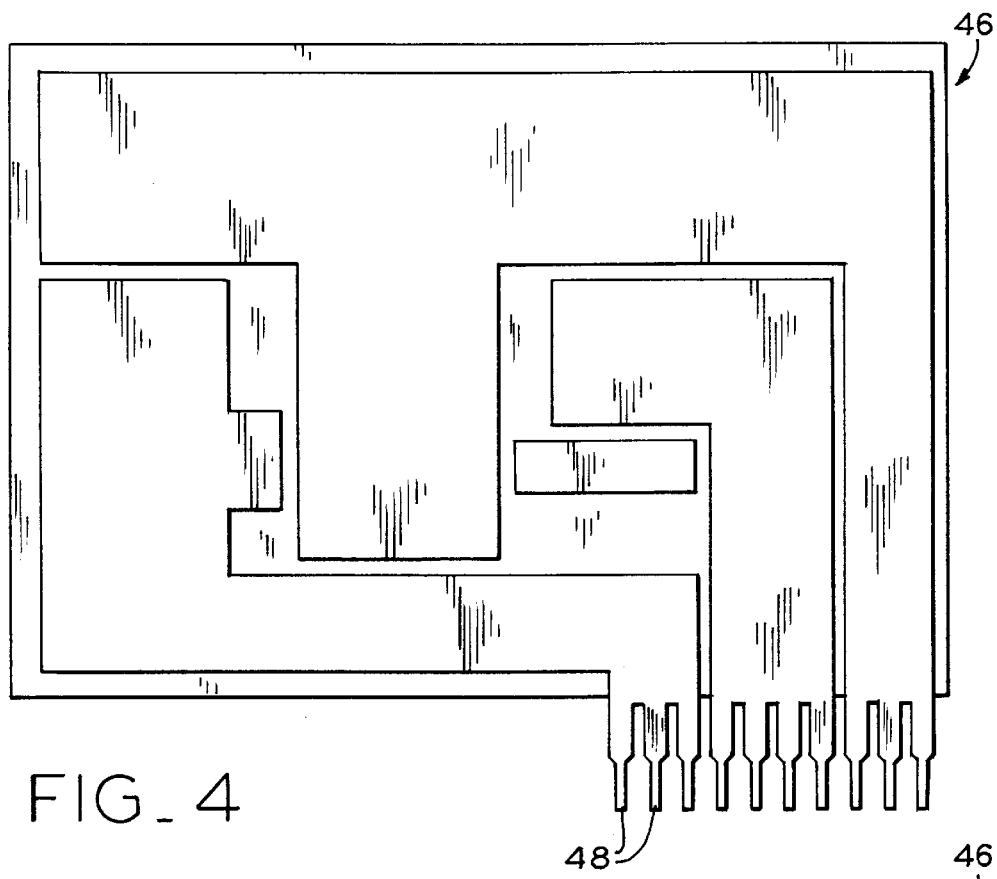
FIG_4
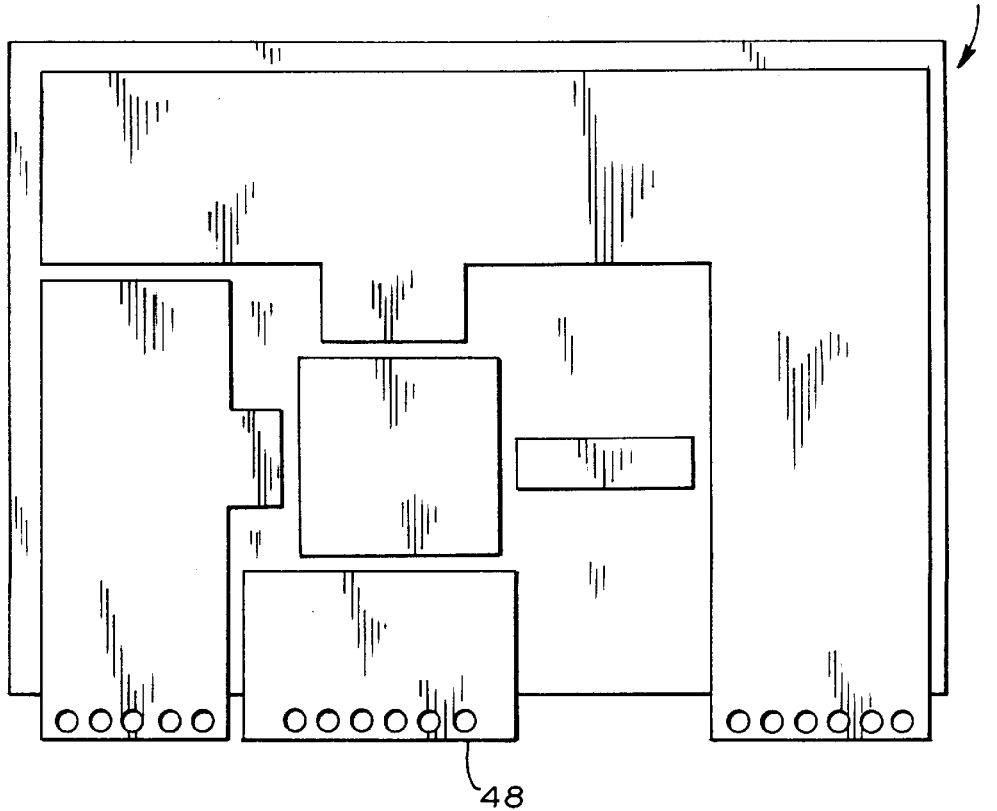
FIG_5

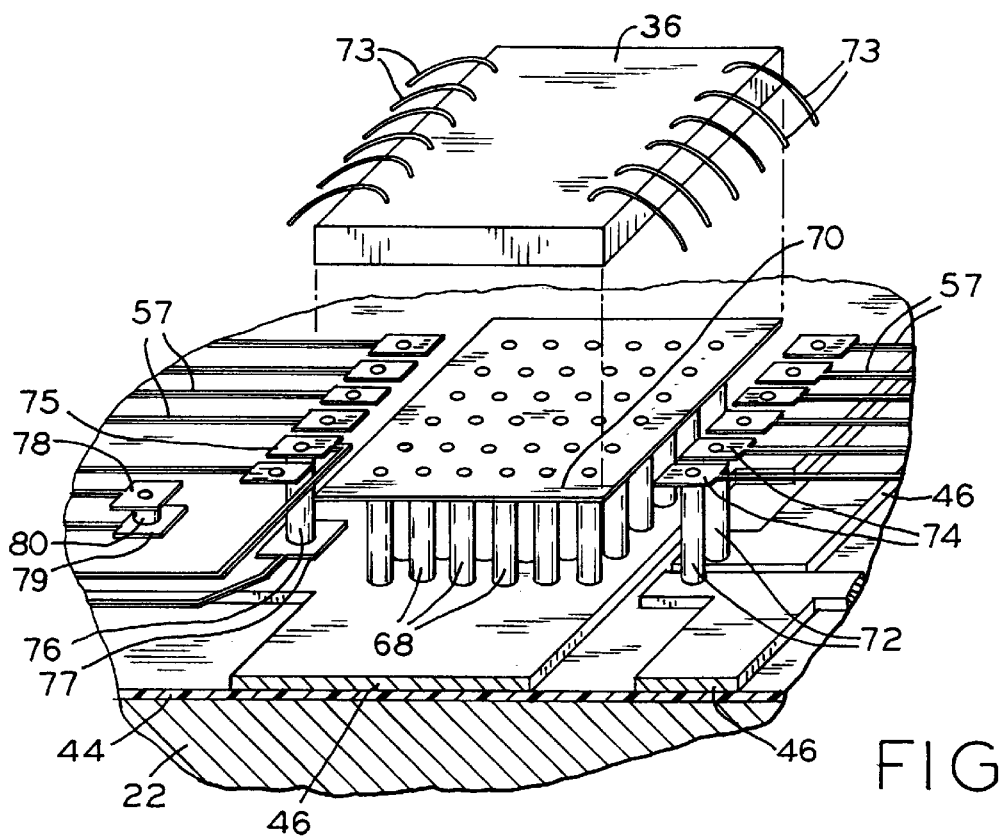
FIG_8
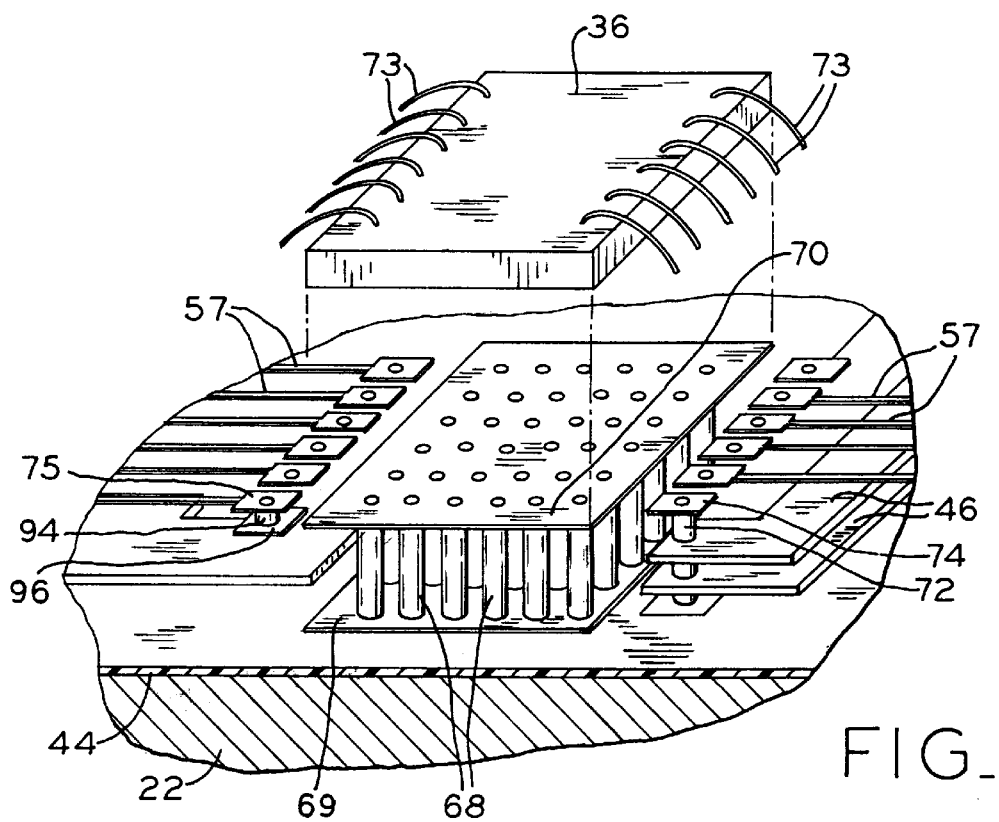
FIG_9

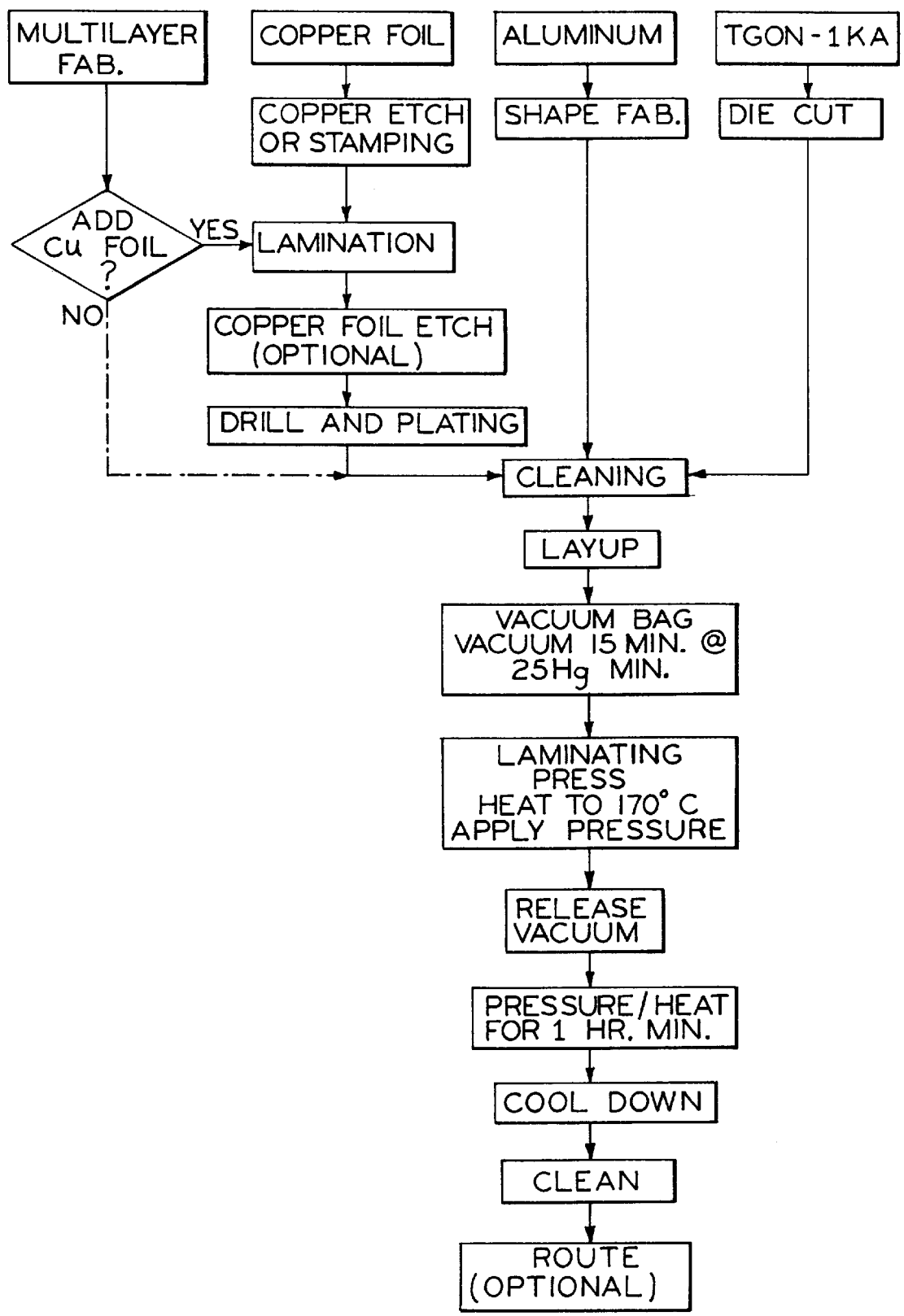
FIG_11

INTEGRATED SUBSTRATE WITH ENHANCED THERMAL CHARACTERISTICS

BACKGROUND OF THE INVENTION

1. Field of the Invention

The present invention generally relates to substrates which interconnect and dissipate heat from power semiconductor elements and more particularly to integrated substrates having enhanced thermal characteristics in which interconnecting wiring patterns for power and control circuit elements are combined.

2. Description of Related Art

Industry has been continually increasing the demand for higher speeds, smaller size, and increased power from circuit boards. Such design requirements are difficult to achieve with the concomitant requirement of removing the heat generated by high density high power designs.

The conventional approach to high density high power design has been the use of power hybrid microcircuits, which include an alumina ceramic substrate base onto which a current-carrying interconnect pattern is either deposited or screen printed. Unfortunately, this interconnect is not suitable for the high current generated by "power semiconductor elements." Instead, "bonding islands" are solder mounted onto the interconnect and in turn, wires that are capable of carrying high current or power semiconductors are mounted onto the islands. The resulting assembly may require a hermetically packaged enclosure. Low current control circuitry, such as integrated circuits, transistors, resistors and capacitors, which serve as control circuits for the power semiconductors, are generally built on a separate substrate in the same enclosure or in a completely separate module.

One recent prior art approach to power modules involves chemically bonding a thin copper layer to an alumina (aluminum oxide) or aluminum nitride ceramic substrate using an oxide interface. The thin copper layer is then electroplated to increase its thickness to greater than 0.005 inches. The substrate is then used to interconnect high current devices. However, current carrying capability is a direct function of cross-sectional area and a high current device therefore requires either a wider or a thicker conductor to have sufficient cross-sectional area. The drawback with alumina or aluminum nitride ceramic substrates which use 0.005 inch thick copper is that these modules are not able to carry high currents without requiring a larger surface area on the module, thereby unsuitably increasing the overall size of the module.

Further developments in the area of alumina or aluminum nitride ceramic substrate technology include chemically bonding thicker copper foils, greater than 0.005 inches, to a ceramic substrate. Even with a thicker foil, however, ceramic based substrates have drawbacks. A ceramic based substrate generally must be mounted on a structural base, otherwise the brittle ceramic material can break. In most applications, size of the circuit is an important consideration, and it is undesirable to waste valuable space with the additional structural base required to support the ceramic substrate. Furthermore, even in applications where a structural base can be avoided, the brittle ceramic substrates require special fasteners to avoid breakage.

Using metal instead of a ceramic base is known in the art. For example, the design disclosed in U.S. Pat. No. 5,513,072 involves a common module containing a power semiconductor element, a circuit board for the power element, a circuit board for a control circuit and a heat spreader fixed on a metal plate. In this design, the power element is mounted onto the heat spreader, which is formed as a copper or copper clad island. In turn, the heat spreader is adhered to the metal plate by a high heat radiating insulating layer made of resin based material so that the heat spreader and the metal plate are electrically insulated from each other. The wiring pattern for the power semiconductor element is formed in a power circuit control board disposed adjacent to one side of the power element on the metal plate. Attached to the metal plate and placed on the opposite side of the power semiconductor is an additional circuit board which is used for wiring control circuitry.

A power module as disclosed by U.S. Pat. No. 5,513,072 includes high and low power devices on one base plate, but suffers drawbacks. First, the wiring pattern for the power semiconductor cannot be placed beneath the power semiconductor in such a design. Instead, a power circuit board is placed adjacent to the power element, thereby using more valuable space on the module. A design allowing the power element wiring pattern to be placed intermediate the power semiconductor element and the metal plate would save valuable space and achieve a smaller module. Furthermore, the design requires a separate heat spreader positioned between the power element and the metal base in order to dissipate heat. A thinner, cheaper module could be constructed if the heat spreader could be eliminated. Finally, a power module like that disclosed by U.S. Pat. No. 5,513,072 requires two separate circuit boards, one of which is for interconnecting high power elements while the other circuit board connects the low power circuitry. A power module having two instead of one circuit board adds a step to the manufacturing process, in turn increasing cost. Furthermore, a power module having two circuit boards requires a larger design than a power module with one circuit board.

It has been known to use thick copper foils in conjunction with metal substrates such as aluminum to remove heat generated by power semiconductors. One known device is an automotive power steering module that utilizes a large (8 inches by 4 inches) copper interconnect pattern bonded to an aluminum substrate. The interconnect pattern is approximately 0.020 inch thick and interconnects large power semiconductors and switches currents greater than 75 amperes. In such an application, the aluminum base serves not only as the mounting platform for the semiconductors but is also an integral part of the system, serving as a structural mounting member in the power steering assembly. In this known application, a low power interconnect using a single layer printed circuit board is bonded to the thick copper foil and provides control signal connections.

Another known product is a power module for a surgical saw. In this power module, a copper interconnect pattern having a thickness greater than 0.010 inches is again bonded to an aluminum substrate and is used to interconnect the switching power transistors that control the brushless motor in the surgical saw. The saw features a high torque which requires switching of currents greater than 30 amperes by the power module.

Yet another known prior art product is a power module for an automotive anti-lock braking system ("ABS system"). This known module also utilizes a thick copper interconnect pattern bonded to an aluminum substrate to interconnect power transistors and to switch the large currents required in the ABS system. As in the above described power steering module, the module for the automotive ABS system also is formed as an integral part of the system, thereby giving structural strength to the overall assembly.

Although some developments have been made in integrating power and control circuit elements while removing heat, it is desirable to further improve the interconnect density and the heat removal capacity of such substrates. It is thus desirable to have a single substrate that is able to (1) handle high currents generated by power semiconductors; (2) route many interconnections in a small area; (3) efficiently remove heat at a reduced cost; (4) integrate low power circuitry required to control high current devices; and (5) offer an overall reduction in size. In addition to these performance features, it is desirable to have an integrated substrate that lends itself to mass production at low cost.

SUMMARY OF THE INVENTION

The present invention overcomes the disadvantages of the above described prior art by providing a thermally efficient multi-layered integrated substrate having wiring patterns for both power semiconductor elements and control semiconductor elements disposed intermediate a top surface of the substrate and a heatsink base.

In one form, the present invention comprises an integrated substrate capable of interconnecting power and control circuit elements. The substrate comprises a base typically made from aluminum which acts as a heatsink. A multilayer printed circuit board is bonded to the base using a thermally conductive and electrically insulating bonding material. The thermally conductive and electrically insulating bonding material of the present invention has excellent thermal properties, namely a very high thermal conductivity. The circuit board includes a first foil interconnect pattern having a thickness greater than 0.010 inches. The first interconnect pattern is disposed intermediate the top surface of the circuit board and the bonding material. The circuit board also includes a second foil interconnect pattern having a thickness less than 0.002 inches. The second interconnect pattern is also disposed intermediate the top surface of the circuit board and the bonding material. A cavity is formed in the top surface of the circuit board and is adapted for receiving a power semiconductor element therein.

In another form, the present invention is an integrated module which comprises a thermally conductive base which acts as a heatsink. A multilayer printed circuit board having at least one control semiconductor element mounted thereto is bonded to the base using a thermally conductive and electrically insulating bonding material. A cavity is disposed in a top surface of the circuit board and a power semiconductor element is mounted in the cavity. The circuit board includes a first wiring pattern connected to the control semiconductor element and a second wiring pattern connected to the power semiconductor element. The first and second wiring patterns are electrically connected to each other.

In yet another form, the present invention comprises an integrated substrate adapted for integrating power and control semiconductor elements. The substrate comprises a thermally conductive base which serves as a heatsink. An electrically conductive foil interconnect pattern having a thickness greater than 0.010 inches is bonded to the base with a thermally conductive and electrically insulating bonding material. Thus, the bonding material is disposed between the base and the foil pattern and bonds the base to the foil pattern. The foil pattern forms a bottom layer of a multilayer circuit board and the circuit board has at least two layers of a control semiconductor element interconnect pattern. The base, bonding material, foil pattern, and the circuit board comprise a series of adjacent layers, respectively. A cavity disposed in a top surface of the circuit board and the foil pattern forms a bottom surface of the cavity.

In still another form, the present invention comprises a multi-layered substrate for supporting high power semiconductors and control elements. The substrate comprises a series of layers. The first layer comprises a base having thermally conductive properties and the base acts as a heatsink. A second layer is disposed adjacent the base and comprises an electrically insulating and thermally conductive bonding material. The bonding material is bonded to the base. A third layer is disposed adjacent the second layer and comprises either a thick copper foil interconnect or a thin copper foil interconnect pattern. The third layer is bonded to the second layer. A fourth layer is disposed adjacent the third layer and comprises a prepared material. The fourth layer is bonded to the third layer. A fifth layer is disposed adjacent the fourth layer and comprises either a thick copper foil interconnect or a thin copper foil interconnect pattern. The fifth layer is bonded to the fourth layer. A sixth layer is disposed adjacent the fifth layer and comprises a core circuit board material. The sixth layer is bonded to the fifth layer. At least one series of layers arranged substantially identically to the third through said sixth layers is bonded to the sixth layer. The series has a bottom layer corresponding to the third layer and a top layer corresponding to the sixth layer. The bottom layer of the series is adjacent to the sixth layer and bonded thereto. The thick copper foil has a thickness greater than 0.005 inches and the thin copper foil has a thickness less than 0.002 inches.

One advantage of the present invention is that it enables wiring patterns for both high power semiconductor elements and control elements to be layered on top of each other in a single module, instead of side-by-side. Yet the present invention, because of its enhanced thermal properties, is still able to dissipate the heat generated by the high power elements without allowing the substrate to overheat. Thus, the present invention allows an integrated substrate to be built more compactly than, for example, a substrate having separate circuit boards for control and power elements with such separate circuit boards being placed side by side. Similarly, the present invention allows an integrated substrate to be built more compactly than a substrate having wiring patterns positioned side-by-side.

Another advantage, related to the first advantage, is that the enhanced thermal properties of the present invention allow a layer upon layer arrangement of power and control wiring patterns spaced relatively closely together. Thus, in addition to decreasing the width and depth of an integrated substrate, the present invention allows a reduction in relative height as well. Furthermore, such a multilayer structure of the present invention allows the mounting and interconnecting of low power devices, such as integrated circuits, transistors, diodes, resistors and capacitors in close proximity to the high power devices.

Another advantage of the present invention is its flexibility. In applications where heat dissipation from the power wiring pattern is at its highest, the wiring pattern for the power elements can be arranged closest to the aluminum heatsink, thereby creating a direct and thus efficient path for thermal transfer. On the other hand, in applications where less heat is generated, the interconnect wiring patterns for the power elements can be arranged in different locations within the multi-layered circuit board, thereby saving manufacturing costs.

Yet another advantage of the present invention is that by using thermal vias, the thermal properties of an integrated substrate of the present invention can be further enhanced. For example, heat produced by a medium power semiconductor element surface mounted to the top surface of an integrated substrate of the present invention can be dissipated by placing thermal vias beneath the bottom surface of the medium power element. The thermal vias extend through the substrate and thereby dissipate heat into the aluminum heatsink.

Another advantage of the present invention is that the aluminum base material has a high thermal conductivity. Thus, heat generated by high power semiconductors can be efficiently dissipated.

Yet another advantage of the present invention is that the aluminum base can be machined, pressed, punched, drawn etc. into shapes that can form an integral part of the overall system which uses the power module. Unlike fragile prior art ceramic material, the aluminum base of the present invention can be shaped and formed as a structural member, giving structural stability to the overall assembly in which it is employed.

Yet another advantage of the present invention relates to cost savings during manufacturing. The multilayer printed circuit board structure, including the thick copper foil, can be manufactured using standard printed circuit board manufacturing techniques commonly available throughout the industry. Further, the manufacturing of the structure can be done in a multiple-up configuration, i.e., manufacturing is done in an array of devices which lowers the manufacturing cost. Furthermore, the integrated structure of the present invention allows for mounting an interconnection of elements using surface mount technology and/or bare die technology, thereby giving the manufacturer the choice of the lowest cost assembly technology available.

Yet another advantage of the present invention is that the thermally conductive material used to bond the multilayer circuit board to the aluminum exhibits excellent thermal properties, such as a high thermal conductivity. Thus, the bonding material is an excellent conductor of heat between the multilayer circuit board and the base, yet the bonding material still electrically isolates the copper foil interconnect pattern from the aluminum base.

Still another advantage of the present invention is that the thermally conductive and electrically insulating bonding material exhibits sufficient bonding characteristics so that an effective and durable bond is formed between the multilayer circuit board and the aluminum base heatsink, and at the same time, heat dissipates efficiently through the bonding material.

Still another advantage of the present invention is that power semiconductors can be interconnected on the substrate without separate leads. Instead, they are interconnected using thick copper foil patterns. Additionally, the leads that interconnect a power module to its next assembly can be fabricated as an integral part of the copper foil pattern, thereby obviating the need to attach separate leads.

Still another advantage of the present invention is that it solves the high current problem by using a thick copper foil pattern having low electrical resistance so that unwanted heating effects are eliminated. Yet, even with a thick copper foil pattern, the present invention still maintains excellent thermal conductivity away from the copper foil through the use of the highly thermally conductive bonding material and the aluminum base.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein:

FIG. 1 is a partially exploded perspective view of an embodiment of the present invention.

FIG. 2 is a side elevational view in partial cross section of FIG. 1.

FIG. 3 is an enlarged cross-sectional view of an indicated portion of FIG. 2.

FIG. 4 is a top plan view of a copper foil interconnect pattern representative of the present invention.

FIG. 5 is a top plan view of a second copper foil interconnect pattern representative of the present invention.

FIG. 8 is a partially exploded and enlarged perspective view of an indicated portion of FIG. 2.

FIG. 9 is a partially exploded and enlarged perspective view of an indicated portion of FIG. 6.

FIG. 11 is a flow diagram illustrating a method for making the present invention.

Figure 6:
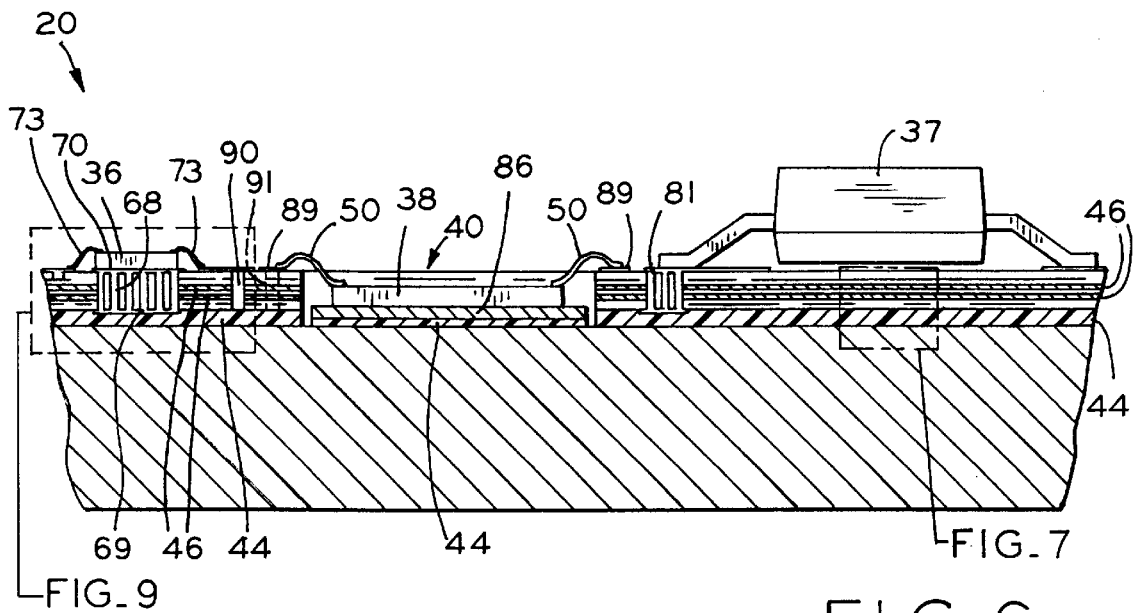
FIG. 6 is a side elevational view in partial cross section of a second embodiment of the present invention.

Corresponding reference characters indicate corresponding parts throughout the several views. Although the drawings represent embodiments of the present invention, the drawings are not necessarily to scale and certain features may be exaggerated while other features may be omitted in order to better illustrate and explain the present invention. The exemplification set out herein illustrates embodiments of the present invention, in different forms, and such forms are not to be construed as limiting the scope of the invention in any manner.

DETAILED DESCRIPTION OF THE INVENTION

It is to be understood that specific circuit elements (power transistors, capacitors, diodes, etc.) shown in the following various embodiments of the present invention are shown for illustrative purposes only. That is, the embodiments described herein are not functioning, working circuits. Instead, specific circuit components are shown merely to illustrate how the novel substrate of the present invention is capable of interconnecting various circuit elements and dissipating heat therefrom.

An exemplary embodiment of the substrate of the present invention is shown in the drawings, in particular by referring to FIG. 1. The integrated substrate, or "module," of the present invention is shown generally at 20 and includes aluminum base 22 to which is bonded multilayer circuit board 24. The substrate is capable of supporting many different circuit elements as shown in FIG. 1. For example, packaged components such as transistors 26, resistors 28, and diode 30 can be surface mounted to top surface 32 of integrated substrate 20. In addition to package components, small capacitors 34 in chip form can also be surface mounted to substrate 20. Integrated circuit (IC) chips such as IC chip 36 as well as larger packaged components, such as transistor 37, can also be surface mounted to substrate 20.

Significantly, the substrate of the present invention exhibits improved thermal characteristics so that "high power semiconductor" elements can be installed within substrate 20. "Power semiconductor element," "power element," or "high power semiconductor element" in the context of this specification is defined as a circuit element, either in packaged or die form having a power output greater than 10 amps and minimum of 10 Watts. Power semiconductors, can include, for example, power transistors and switches for high current devices. Power semiconductors can also include MOSFETs, IGBTs, thyristors, triacs, SRCs, bipolar transistors, power amplifiers, GaAs devices, diodes, and voltage and current regulators. Further, a "control circuit element," "control element," or "control semiconductor element" is defined herein as a circuit element having relatively low power output. Control semiconductor elements include linear and digital circuits used to control the power elements and include common resistors, capacitors, IC chips, diodes and the like. Typical control circuitry would be drivers for power transistors, amplifiers, voltage and current regulators, D/A and A/D converters, logic functions and the like.

Having defined "power" and "control" elements, a feature of the present invention is that both power and control elements can be installed into a single integrated substrate 20. Further, the wiring, or "interconnect" patterns for both the power and control elements can be included between top surface 32 and aluminum base 22 of substrate 20, allowing a compact density of power and control elements. With reference to FIG. 1, power semiconductor element 38 is mounted in cavity 40, which cavity is formed partially or fully into multilayer circuit board 24.

The advantages of the integrated substrate of the present invention will become clear from considering the novel arrangement of materials in a specific embodiment. First, with reference to FIGS. 1 through 3, the bottom layer of substrate 20 is comprised of a thick aluminum base 22, which serves as a heatsink. As shown in FIG. 1, heatsink base 22 is substantially thicker than circuit board 24. Although shown as a rectangular shape in FIG. 1, aluminum base 22 can, advantageously, be of a shape that will serve as a structural member of the system in which the integrated substrate is used. Generally, base 22 is a flat shape that can be punched, cut or machined from sheet material. However, aluminum base 22 can be formed with fins (not shown) to enhance heat removal from substrate 20.

The type of aluminum material chosen for base 22 is not significant in the present invention. There are virtually hundreds of different aluminum compositions commercially available. Furthermore, the material for base 22 could be made from a material other than aluminum, such as copper or other metals, and still remain within the scope of the present invention. In applications that require wire to be bound to aluminum base 22, a material composition with less impurities would be required. Present designs have been made with aluminum type 6061, which has good mechanical strength, good thermal characteristics, and also exhibits good wire bonding characteristics.

Turning again to FIGS. 1–3, and particularly to FIG. 3, which shows an enlarged view of the layers of substrate 20, multilayer circuit board 24 is shown bonded to aluminum base 22. Multilayer circuit board 24 can be comprised of varying numbers of layers and such layers can vary in arrangement, type and thickness, as explained below. FIGS. 1–3 show one specific embodiment of multilayer circuit board 24. Circuit board 24 is bonded to aluminum base 22 with a thermally conductive organic bonding material shown at 44. Bonding material 44 should be electrically insulating and have excellent thermal characteristics. One suitable material for bonding material 44 is Tgon-1KA, manufactured by Thermagon Inc. Tgon-1KA combines a thermosetting epoxy with a boron nitride filler which forms a bonding material with excellent thermal characteristics, having a thermal conductivity of greater than 8 W/m-K. Tgon-1KA is fabricated in a B-stage form and is available in sheets that can be die-cut into the required shape and size. However, other thermally conductive materials available as a B-stage prepared can be used as bonding material 44 in lieu of the Tgon-1KA, provided that such material exhibits excellent thermal characteristics, preferably greater than 8 W/m-K.

The next layer above bonding material 44, as seen in FIG. 3, is "thick" copper foil interconnect pattern 46. In the embodiment shown in FIGS. 1 through 3, interconnect pattern 46 is used to interconnect power element 38 to the control elements and also to the next stage in the assembly to which substrate 20 is connected. For example, integrated substrate 20 could be connected to a high torque motor, or similar device. The thickness of foil pattern 46 is a function of required current carrying capacity of the particular module. The number and power output of power elements installed on a particular integrated substrate of the present invention will vary from one application to another. That is to say, multiple cavities (not shown) can be provided in top surface 32 with one or more power elements installed in each cavity. Accordingly, required current-carrying capabilities will vary. Typical thicknesses for foil 46 range from 0.010 inches to 0.020 inches. Foil 46 is formed into an interconnect pattern for substrate 20, such as shown in FIGS. 4 and 5. Foil 46 can also be formed with leads 48 as shown in FIGS. 4 and 5, which leads are used to connect the substrate to the next stage in the assembly (not shown). Although it is not shown in the drawings, leads 48 can be made to extend beyond the limits of the vertical walls of substrate 20 to aid in connection of substrate 20 with the next stage in the assembly.

The thermal advantages of the thick foil pattern 46 installed in substrate 20 become evident when considering the arrangement of power element 38, foil 46, bonding material 44 and base 22. With reference to FIGS. 1 and 2, cavity 40 is formed in multilayer circuit board 24, which cavity exposes thick foil 46. With reference to FIG. 1, power element 38 mounts directly to foil 46. As shown in FIG. 2, connecting wires 50 electrically connect power element 50 to foil 46. With reference to FIG. 2, the superior heat conduction away from power element 38 can be appreciated. First, element 38 is mounted directly and fits flush against foil 46. Foil 46, which is formed typically from copper, serves as an excellent conductor of heat, so that heat generated by element 38 is conducted away by foil 46. Next, foil 46, being the bottom layer of circuit board 24, is bonded to aluminum heatsink 22 with thermally conductive bonding material 44. As explained above, thermally conductive bonding material 44 exhibits excellent thermal properties so that heat is efficiently conducted away from foil 46. Finally, heatsink 22, having a high thermal conductivity, and because of its large size and thickness relative to power element 38, absorbs the heat conducted through bonding material 44.

Thus, heat is efficiently transferred from power element 38 to heatsink 22, allowing substrate 20 to integrate power and control elements without overheating. Several factors make this novel design possible. First, by using a thick copper foil, such as foil 46, large amounts of heat are able to be dissipated without increasing the overall area occupied by the substrate. Second, as mentioned, the thermally conductive and electrically insulating bonding material possesses such a high thermal conductivity that heat can be transferred efficiently to the aluminum heatsink, which heatsink also exhibits good thermal properties. Further, in the arrangement of layers shown in FIG. 3, in which power element interconnect 46 is positioned as the bottom layer of multilayer circuit board 24, direct transfer of heat from interconnect 46 to heatsink 22 through bonding material 44 is achieved. Thus, the relative arrangement of components and layers of the substrate, as well as strategic positioning of thermal vias, as will be explained below, enhance the thermal properties of substrate 20.

In a substrate of the present invention, circuit board 24 is comprised of a series of layers, the sequence of which repeats, depending upon the ultimate number of layers required for the particular application. With reference to FIG. 3, the layer immediately above and adjacent to thick foil 46 is a standard prepared bonding material 52, the composition of which is widely known in the art. Prepared material 52 is used to bond thick foil 46 with thin foil interconnect pattern 54 as shown in FIG. 3. For particularly high heat applications, conventional prepared material 52 can be replaced with a highly thermally conductive and electrically insulating bonding material such as the Tgon-1KA used for layer 44, as discussed above.

Figure 10:
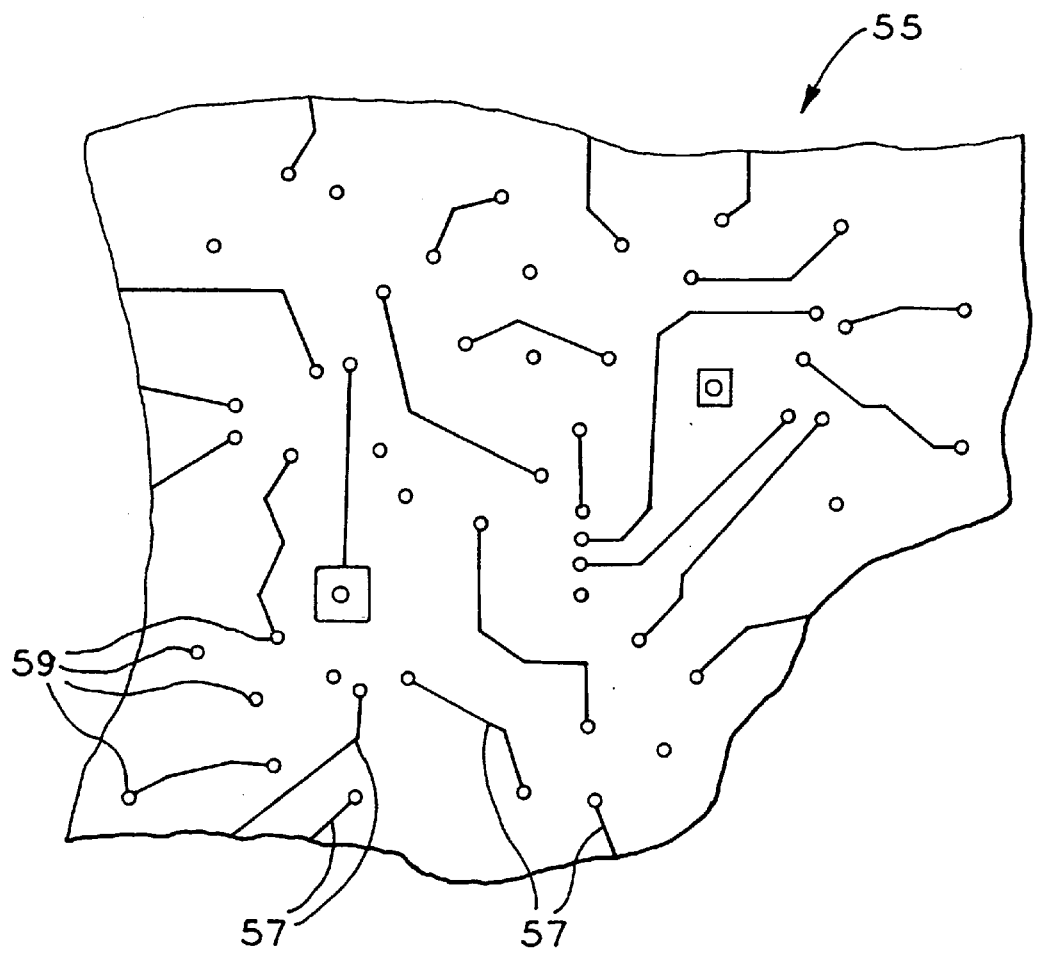
FIG. 10 is a top plan view of a portion of a generic wiring pattern.

Foil 54 is the next adjacent layer in the substrate as shown in FIG. 3. Foil 54 is a typical thin copper foil used to interconnect control elements and its use is known to one of skill in the art. As used in the substrate of the present invention, foil 54 has a thickness typically in the range of 0.0005 to 0.002 inches. As shown in FIG. 3, layers 58, 60, 62 and 64 are also "thin" foils and have an appearance quite similar to layer 54. A portion of a "generic" thin foil pattern 55, shown in FIG. 10, is fairly representative of an interconnect pattern used in the multiple layers of the present invention to wire the control elements. These control interconnect patterns are interconnected using standard circuit board techniques. Interconnect wires 57 are arranged in a pattern corresponding with the particular circuit design and can electrically interconnect to other levels of the multilayer substrate through drilled and plated holes 59 as shown in FIG. 10.

Returning now to the arrangement of layers of circuit board 24 shown in FIG. 3, the layer adjacent and above layer 54 is a circuit board core material 66. Core material 66 can be selected from a variety of circuit board materials, such as polyimide-glass for example, and such core materials are widely known in the art. Immediately above and adjacent to core material 66 is thin foil pattern 58, and one can now appreciate that the sequence of materials in multilayer circuit board 24 has begun to repeat. Thus, adjacent and above foil pattern 58 is prepared material 52 followed by interconnect pattern 60, core material 66, and interconnect 62. The sequence of layers for multilayer circuit board 24 repeats itself again with prepared material 52, interconnect layer 64, core material 66, and finally top interconnect pattern 56.

As suggested above, the control interconnect patterns can be connected to thick interconnect pattern 46, which is used to interconnect power elements, such as element 38. Additionally, the thermal characteristics of substrate 20 can be enhanced by using "vias." Turning now to FIG. 8, an enlarged and partially exploded portion of FIG. 2 is shown in detail. Certain parts, such as prepared material 52 and core material 66, have been omitted from FIG. 8 for clarity. Furthermore, only portions of interconnect patterns 54–64 are shown in FIG. 8 so that the novel features of the present invention can be clearly illustrated.

At the bottom of FIG. 8 is shown aluminum heatsink 22, to which thermally conductive bonding material 44 is bonded. Thick copper foil 46 is bonded to bonding material 44. FIG. 8 primarily illustrates the use of thermal vias in the present invention, which vias can be used to conduct heat and/or electric signals. A thermal via is a pipe, typically made from copper, which can be hollow or filled. For example, as seen in FIG. 8, vias 68 are connected to thick copper interconnect 46 at their bottom end, and are connected to IC bonding pad 70 at their top end. IC chip 36, shown as exploded away from pad 70, is mounted to pad 70 in such a way so that the bottom surface of IC chip 36 is in contact and flush with pad 70 as shown in FIG. 2. Thus, with reference to FIG. 8, heat is conducted away from chip 36 through pad 70, vias 68, and into copper layer 46. In turn, heat is ether dissipated to bonding material 44 and finally into aluminum heatsink 22.

In addition to enhancing heat removal, vias can be used to conduct electricity from the thin interconnect patterns, such as top interconnect pattern 56, to thick interconnect pattern 46. As shown in FIG. 8, vias 72 connect to thick pattern 46 at their bottom end and connect to bond pads 74 at their top end. Electrical wires 73 from chip 36 connect to pads 74 when chip 36 is installed on substrate 20. An electrical path is thereby created between chip 36 and thick interconnect pattern 46. In this manner, control circuitry, such as chip 36 can be electrically connected to the thick interconnect pattern, which in turn interconnects power elements, such as element 38.

Vias can also be used to conduct electricity and heat from one layer of control interconnect to another. For example, via 76 connects from pad 74 on top interconnect layer 56 to another pad 77 on interconnect layer 54, conducting electricity and heat therebetween. "Blind," or "buried" vias are also possible. Buried via 80, for example, connects bonding pad 78 to bonding pad 79, thereby providing an electrical and thermal connection between interconnect layer 64 and interconnect layer 62. In turn, wires 57 transmit electrical signals to other parts of the substrate.

By employing the use of vias as described above, circuit implementation can be optimized. "Medium power elements," such as a device with a power dissipation up to 5 Watts, and/or a current of less than 5 A can be surface mounted to top surface 32 of substrate 20. For example, with reference to FIG. 1, large packaged component 37 may generate an amount of heat large enough so that surface mounting to top surface 32 would not be possible without heat dissipation benefits derived from the use of thermal vias. Thus, as seen in FIG. 1, vias 81 are installed into substrate 20. Similarly, IC chip 36 shown in FIGS. 1 and 8 may need to operate at a relatively low temperature in order to avoid damage to the delicate components therein. With reference to FIG. 1, thermal vias 70 enhance heat removal and allow chip 36 to operate at a lower temperature.

Figure 7:
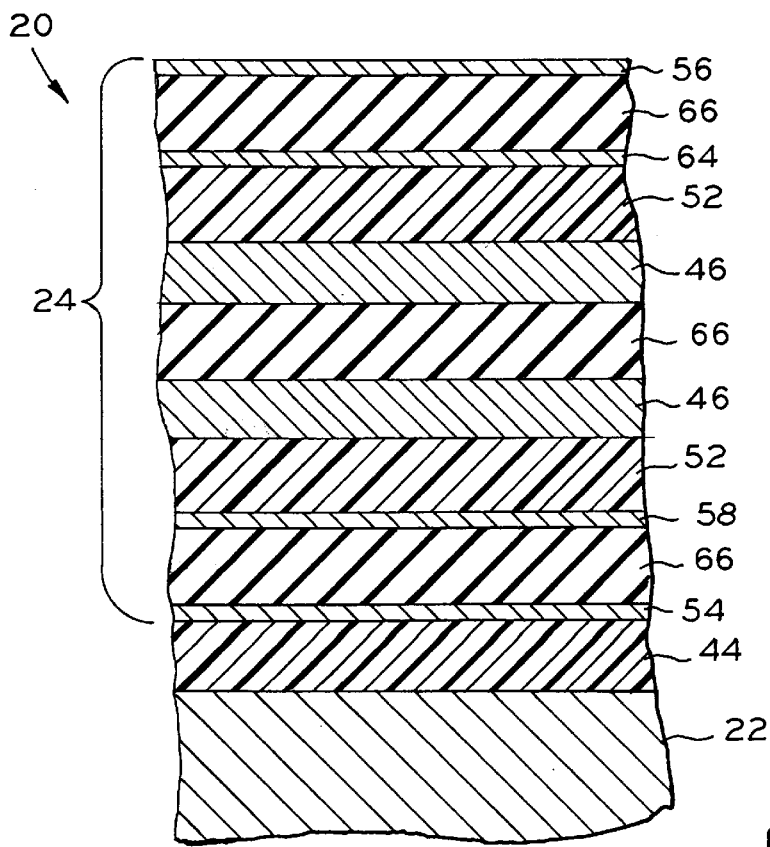
FIG. 7 is an enlarged cross-sectional view of an indicated portion of FIG. 6.

A second embodiment of the present invention is shown in FIGS. 6, 7 and 9. Corresponding reference characters indicate parts corresponding to the first embodiment. The second embodiment differs primarily from the first embodiment in the arrangement of layers in multilayer circuit board 24.

Turning now to FIGS. 6 and 7, the bottom layer of substrate 20 is base 22, which serves as a heatsink. With reference to FIG. 7, multilayer circuit board 24 is bonded to heatsink 22 with a thermally conductive organic bonding material shown at 44. The Tgon-1KA material, discussed above, is an exemplary material for bonding material 44 because of its excellent thermal properties.

The next layer above and adjacent bonding material 44 as seen in FIG. 7 is interconnect pattern 54. As in the first embodiment, described above, foil 54 is a typical thin copper foil used to interconnect control elements and its use is known to one of skill in the art. Foil 54 has a thickness typically in the range of 0.0005 to 0.002 inches. As shown in FIG. 7, layers 58 and 64 are also "thin" foils and have an appearance quite similar to layer 54. A portion of a "generic" thin foil pattern 55, shown in FIG. 10, is fairly representative of an interconnect pattern used in all of the multiple layers of the present invention to wire the control elements. These control interconnect patterns are interconnected using standard circuit board techniques known in the art. As shown in FIG. 10, interconnect wires 57 are arranged in a pattern depending upon the particular circuit design and can electrically interconnect to other levels of the multilayer substrate through drilled and plated holes 59.

The bottom side of foil pattern 54 is bonded to bonding material 44 whereas the top side of foil pattern 54 is connected to core material 66, which is a standard circuit board core material. Core material 66 can be selected from many circuit board core materials known in the art. Interconnect layer 58 is connected to the top side of core material 66. Layer 58 is bonded to prepared bonding material 52, which is comprised of a standard prepared bonding material widely known in the art. Alternatively, bonding material 52 can be the same Tgon-1KA material used for bonding material 44.

Adjacent and bonded to the top side of prepared material 52 is a layer of thick copper interconnect 46. Layer 46 interconnects the power elements, such as element 38, in substrate 20. Adjacent and on top of interconnect layer 46 is core material 66 followed by another thick layer 46, which also interconnects power elements. Thus, unlike the first described embodiment, wherein only one layer of thick interconnect foil was employed, the second embodiment shows that more than one thick copper foil can be used to interconnect the power elements of substrate 20. While, generally speaking, the most efficient heat dissipation is achieved from arranging interconnect pattern 46 as the bottom layer in circuit board 24, several circuit board layers can be disposed between interconnect pattern 46 and base 22. Thus, FIG. 7 shows two thick interconnect patterns 46 sandwiched between two layers of prepared bonding material 52, the interconnect patterns 46 being positioned several layers away from base 22. Depending upon the heat generated by copper layers 46, it may be desirable to use a highly thermally conductive bonding material such as the Tgon-1KA as bonding material 52, especially adjacent power element interconnect layers, such as layers 46. However, it has been found that adequate heat dissipation can usually be achieved by using a standard prepare bonding material. Separating the two thick copper layers is a core material 66. When two or more interconnect layers are employed to interconnect power elements, the inventors have found that the relative thickness of each layer can be decreased. For example, the present inventors have successfully built a substrate employing two layers 46 as shown in FIG. 7 with each layer 46 having an approximate thickness of 0.005 inches.

As further shown in FIG. 7, three remaining layers above layer 52 complete multilayer circuit board 24. Layer 64 is again a typical thin interconnect foil used in multilayer printed circuit boards and is used to interconnect control elements and has a general appearance as shown in FIG. 10. Core material 66, the second layer from the top of multilayer circuit board 24, is comprised of the same core material as used for other layers 66 shown in FIG. 7. Finally, top interconnect layer 56 has a general appearance substantially the same as shown on top surface 32 in FIG. 1.

As shown in FIG. 6, cavity 40 in multilayer circuit board 24 differs from the cavity shown in the first embodiment because of the differing arrangement of thick copper layers in the first and second embodiments of the present invention. With reference to FIG. 6, power element 38 is bonded to heat spreader 86. Heat spreader 86 is typically comprised of copper although other suitable materials can be used for heat spreader 86. Heat spreader 86 is bonded to bonding material 44, which in turn is bonded to aluminum heatsink 22. Heat is thus transferred from power element 38 to heat spreader 86 and is further transferred to aluminum heatsink 22 through thermally conductive bonding material 44. As shown in FIG. 6, power element 38 is electrically connected through wires 50 to bonding pads 89. Via 91 (shown in phantom lines) connects power element 38 into thick copper foils 46. Similarly, as shown in FIG. 6 and explained in further detail below, via 90 connects IC chip 36 through wires 73 into the thick copper foils 46.

Turning now to FIG. 9, which is a partially exploded enlarged perspective view of a portion of FIG. 6, the thermal and electrical connection between power elements, control elements, and interconnect patterns can be better understood. For clarity of illustration, core material 66 as well as prepare bonding material 52 are not shown in FIG. 9. Furthermore, only portions of interconnect patterns 54, 56, 58, and 64 are shown in FIG. 9 so that the novel features of the present invention can be clearly illustrated.

At the bottom of FIG. 9 is shown aluminum heatsink 22, to which thermally conductive bonding material 44 is bonded. FIG. 9 further illustrates the use of thermal vias in the present invention, which vias can be used to conduct heat and/or electric signals. For example, vias 68 are connected to a bonding pad 69 at their bottom ends and are connected to IC bonding pad 70 at their top ends. Bonding pads 69 and 70 can also be seen at the bottom and top of multilayer circuit board 24 in FIG. 6. IC chip 36 is shown as exploded away from pad 70 in FIG. 9 and is shown attached to pad 70 in FIG. 6. When installed on substrate 20, chip 36 is mounted to pad 70, in such a way so that the bottom surface of IC chip 36 is in contact and flush with pad 70 as shown in FIG. 6. Thus, heat is conducted away from chip 36 through pad 70, vias 68, and into bonding pad 69, which acts as a heat spreader. Heat is in turn conducted to bonding material 44 and finally into aluminum heatsink 22. Chip 36 can therefore be maintained at a lower temperature than without the presence of vias 68.

Vias can be used to connect control circuit elements into thick copper layers 46. As shown in FIG. 9, via 72 electrically interconnects the two layers 46 of thick interconnect pattern. Further, via 72 electrically connects to bond pad 74 as shown. In turn, bond pad 74 electrically connects to wire 73 of IC Chip 36. An electrical path is thereby created between chip 36 and thick interconnect patterns 46. In this manner, control circuitry, such as chip 36 can be electrically connected to the thick interconnect pattern, which in turn interconnects power elements, such as element 38.

Additionally, vias can be used to electrically and thermally connect two or more layers of control interconnect patterns. As shown in FIG. 9, via 94 connects from pad 75 on top interconnect layer 56 to another bonding pad 96 on interconnect layer 64, conducting electricity and heat therebetween. Thus, a respective wire 73 conducts electricity from chip 36 to bond pad 75, and electricity is further conducted to bond pad 96 through via 94. Electrical signals are further transmitted to another part of the circuit through wires 57.

With reference to FIG. 11, the preferred method of manufacturing the present invention is now explained.

First, several layers of multilayer printed circuit board 24, shown in FIGS. 1 and 2, are fabricated using standard printed circuit board ("PCB") manufacturing techniques into a structure that contains the interconnect for all low power circuitry associated with module 20. In other words, layers 54 through 56 as shown in FIG. 2 are fabricated as a first step. As noted, in some applications, a double layer thick copper foil 46 as shown in FIGS. 6 and 7 can be fabricated into circuit board 24. During the fabrication process, all holes that are associated with the low power circuitry are drilled and plated.

In embodiments such as the first embodiment described above and shown in FIGS. 1–3 and 8, where a single thick copper foil interconnect pattern 46 is employed, the last step of formation of circuit board 24 is the lamination of thick copper foil pattern 46. Foil 46 can be etched into a pattern like that shown in FIGS. 4 and 5 prior to or after lamination. When the etching is done is dependent upon the foil thickness required for foil 46. Thinner foils can be etched after lamination. Foil 46 is laminated to the multi-layer circuit board using standard high temperature prepare material 52 and lamination processes well-known to one skilled in the art. If additional thermal paths are required for the lower power circuitry, the foil may be laminated using the Tgon-1KA material used to bond the foil 46 to aluminum base 22.

The cavities 40 are either punched out or rounded out after lamination of the PCB structure, prior to lamination of the heatsink base, or prior to lamination of the thick copper foil and heat sink.

Multilayer circuit board 24 is then drilled and copper plated for all the power connections. Where medium power devices are to be surface mounted on top surface 32 as shown in FIG. 1, or enhanced thermal characteristics are needed, thermal vias are drilled and plated in an array capable of dissipating the appropriate power. Final overplating of nickel and optionally gold is then applied and the structure is ready for the final bonding process.

Next, multilayer circuit board 24 and aluminum base 22 are bonded together with thermally conductive organic bonding material 44, such as Tgon-1KA, manufactured by Thermagon Inc. This material combines a thermosetting epoxy with a boron nitride filler to form a bonding material with excellent thermal characteristics. The thermal conductivity of material 44 is greater than 8 Watts per meter per degree Kelvin. Material 44 is fabricated in a B-stage form and is available in sheets that can be die-cut into the desired shape and size. Other thermally conductive material available as a B-stage prepare can be used in lieu of the Tgon-1KA, provided such bonding material also possesses the requisite thermal properties, such as thermal conductivity, coefficient of expansion, etc.

Where thermal vias are installed, the vias would be connected to the thick copper layer 46 at the bottom of circuit board 24 as shown in FIG. 2, or alternatively, to thin copper layer 54 at the bottom of circuit board 24 as shown in FIG. 6. Thus, in use of substrate 20, heat is spread to thermally conductive bonding material 44 and aluminum base 22.

The bonding process starts with an assembly of multilayer circuit board 24, bonding material 44 and aluminum base 22, which are stacked on top one another. This assembly is put in a vacuum bag and evacuated to at least 25" Hg. for a minimum of 15 minutes. The evacuated assembly is then placed in a laminating press capable of applying heat and pressure to the assembly. The assembly is heated to a bonding temperature of 170° C.–175° C. and then a minimum pressure of 50 psi is applied to the assembly. The pressure required is a function of foil thickness and size. When the bonding temperature has been reached, the vacuum is released. The assembly is maintained at the cure temperature for a minimum of 1 hour, then cooled under pressure before being removed from the laminating press. If the substrates have been laminated in array form, the assembly can then be separated by routing.

Each integrated substrate is then processed through an assembly process whereby power semiconductors are mounted in cavities, such as cavity 40, and other devices are attached, either directly or on tabs. The appropriate sections of the assembly are then overmolded using a compatible molding compound to protect the semiconductors from environmental effects.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. An integrated substrate capable of interconnecting power and control circuit elements, said substrate comprising:
   a heatsink base having thermal conductive properties;
   a multilayer printed circuit board;
   a thermally conductive and electrically insulating bonding material which bonds said circuit board to said base;
   said circuit board including a first foil interconnect pattern having a thickness greater than 0.005 inches, said first interconnect pattern disposed intermediate a top surface of said circuit board and said bonding material;
   said circuit board including a second foil interconnect pattern having a thickness less than 0.002 inches, said second interconnect pattern disposed intermediate said top surface of said circuit board and said bonding material; and
   a cavity disposed on said top surface of said circuit board adapted for installing a power semiconductor element therein, said first foil interconnect pattern being accessible through said cavity.

2. The substrate of claim 1, wherein a power semiconductor element is mounted in said cavity and electrically connected to said first foil pattern.

3. The substrate of claim 2, wherein a control circuit element is connected to said circuit board, whereby said control circuit element controls said power semiconductor element.

4. The substrate of claim 3, wherein said control circuit element is electrically connected to said second foil pattern.

5. The substrate of claim 3, wherein said power semiconductor element has a power output of greater than 5 Watts.

6. The substrate of claim 1, wherein said cavity comprises a plurality of cavities and a plurality of control circuit elements are connected to said substrate.

7. The substrate of claim 6, wherein each said cavity has installed therein at least one power semiconductor element, the power semiconductor elements are controlled by the control circuit elements, and the power semiconductor elements in the aggregate generate a total power output of greater than 5 Watts.

8. The substrate of claim 1, wherein said first interconnect is electrically connected to said second interconnect.

9. The substrate of claim 1, wherein said base is made of aluminum and wherein said first and second foil patterns are made of copper.

10. The substrate of claim 1, wherein a thermal via is disposed in said circuit board, said thermal via thermally connects said first foil interconnect pattern to said base.

11. The substrate of claim 1, wherein a thermal via is disposed in said circuit board, said thermal via electrically connects said first foil interconnect pattern to said second interconnect pattern.

12. The substrate of claim 1, wherein:
a thermal via is disposed in said circuit board;
a first end of said thermal via is contiguous with said top surface of said circuit board and a second end of said thermal via is contiguous with a bottom surface of said circuit board and in thermal contact with said base.

13. The substrate of claim 1, wherein:
a thermal via is disposed in said circuit board;
said via has a top and bottom end;
said top and bottom ends are disposed intermediate said top surface and said bonding material.

14. The substrate of claim 1, wherein said first interconnect pattern comprises a plurality of layers, said layers thermally and electrically connected by at least one thermal via.

15. The substrate of claim 1, wherein said bonding material combines a thermosetting epoxy with a boron nitride filler.

16. The substrate of claim 1, wherein said bonding material has a thermal conductivity of at least 8 Watts per meter per degree kelvin.

17. The substrate of claim 1, wherein said second interconnect pattern comprises a plurality of interconnect patterns.

18. The substrate of claim 1, wherein said first interconnect pattern comprises a plurality of interconnect patterns.

19. The substrate of claim 1, wherein said base is significantly thicker than said multilayer circuit board.

20. An integrated substrate having enhanced thermal properties comprising:
a thermally conductive heatsink base;
a multilayer printed circuit board having at least one control semiconductor element mounted to a top surface thereof;
a thermally conductive and electrically insulating bonding material which bonds said circuit board to said base;
a cavity disposed in a top surface of said circuit board, a power semiconductor element mounted in said cavity;
said circuit board including a first wiring pattern connected to the control semiconductor element;
said circuit board including a second wiring pattern connected to the power semiconductor element; and
said first wiring pattern electrically connected to said second wiring pattern.

21. The integrated substrate of claim 20, wherein said first wiring pattern has a thickness less than 0.002 inches.

22. The integrated substrate of claim 21, wherein said second wiring pattern has a thickness greater than 0.005 inches.

23. The integrated substrate of claim 22, wherein said second wiring pattern has a thickness less than 0.020 inches.

24. The integrated substrate of claim 20, wherein at least one thermal via is disposed in said substrate, said thermal via transfers heat from said circuit board to said base, said via electrically connected to said first and said second wiring patterns.

25. The integrated substrate of claim 24, wherein said at least one thermal via comprises a plurality of vias.

26. The integrated substrate of claim 20, wherein said base is made of aluminum and said first and second wiring patterns are made of copper.

27. The integrated substrate of claim 20, wherein said second wiring pattern is arranged in a plurality of layers.

28. The integrated substrate of claim 27, wherein said plurality of layers are electrically and thermally connected by at least one thermal via.

29. The integrated substrate of claim 20, wherein said second wiring pattern forms a bottom surface of said cavity.

30. The integrated substrate of claim 20, wherein a heat spreader forms a bottom surface of said cavity, said heat spreader mounted to said base with said thermally conductive and electrically insulating bonding material.

31. The integrated substrate of claim 20, wherein said base forms a bottom surface of said cavity.

32. An integrated substrate adapted for integrating power and control semiconductor elements, said substrate comprising:
a thermally conductive heatsink base;
an electrically conductive foil interconnect pattern, said foil pattern having a thickness greater than 0.0005 inches;
a thermally conductive and electrically insulating bonding material disposed between said said base and said foil pattern, whereby said bonding material bonds said foil pattern to said base;
said foil pattern forming a bottom layer of a multilayer circuit board;
said circuit board containing at least two layers of a control semiconductor element interconnect pattern;
said base, said bonding material, said foil pattern, and said circuit board comprising a series of adjacent layers, respectively;
a cavity disposed in a top surface of said circuit board; and
said foil pattern forming a bottom surface of said cavity.

33. The integrated substrate of claim 32, wherein said base is made from aluminum and said foil pattern is made from copper.

34. The integrated substrate of claim 33, wherein said thermally conductive and electrically insulative bonding material has a thermal conductivity greater than 8 watts per meter per degree Kelvin.

35. The integrated substrate of claim 34, wherein a thermal via is disposed in said circuit board.

36. The integrated substrate of claim 35, wherein said thermal via electrically connects at least one of said layers of control interconnect pattern with said foil pattern.

37. An integrated multi-layer module for supporting high power semiconductors and control elements, said module comprising:
a first layer comprising a base, said base having thermal conductive properties and acting as a heatsink;
a second layer disposed adjacent said base, said second layer comprising an electrically insulating and thermally conductive bonding material, said bonding material bonded to said base;
a third layer disposed adjacent said second layer, said third layer comprising one of a thick copper foil interconnect and a thin copper foil interconnect pattern, said third layer bonded to said second layer;

- a fourth layer disposed adjacent said third layer, said fourth layer comprising a thermally conductive prepare material, said fourth layer bonded to said third layer;
- a fifth layer disposed adjacent said fourth layer, said fifth layer comprising one of a thick copper foil interconnect and a thin copper foil interconnect pattern, said fifth layer bonded to said fourth layer;
- a sixth layer disposed adjacent said fifth layer, said sixth layer comprising a core circuit board material, said sixth layer bonded to said fifth layer;
- at least one series of layers, said series arranged substantially identically to said third through said sixth layers, said series having a bottom layer corresponding to said third layer and a top layer corresponding to said sixth layer, said bottom layer of said series adjacent to said sixth layer and bonded thereto;
- said thick copper foil having a thickness greater than 0.005 inches and said thin foil having a thickness of less than 0.002 inches.

38. The module of claim 37, wherein a cavity is disposed in a top surface of said module, said cavity adapted for mounting a power semiconductor element therein.

39. The module of claim 38, wherein a thermal via is disposed in said module.

40. An integrated substrate having enhanced thermal properties comprising:
- a thermally conductive heatsink base;
- a multilayer printed circuit board having at least one control semiconductor element mounted thereto:
- a thermally conductive and electrically insulating bonding material which bonds said circuit board to said base, said thermally conductive bonding material having a thermal conductivity of at least 8 Watts per meter per degree Kelvin;
- a cavity disposed in a top surface of said circuit board, a power semiconductor element mounted in said cavity;
- said circuit board including a first wiring pattern connected to the control semiconductor element;
- said circuit board including a second wiring pattern connected to the power semiconductor element; and
- said first wiring pattern electrically connected to said second wiring pattern.

41. The integrated substrate of claim 40, wherein said first wiring pattern has a thickness less than 0.002 inches.

42. The integrated substrate of claim 41, wherein said second wiring pattern has a thickness greater than 0.005 inches.

43. The integrated substrate of claim 42, wherein said second wiring pattern has a thickness less than 0.020 inches.

44. The integrated substrate of claim 40, wherein at least one thermal via is disposed in said substrate, said thermal via transfers heat from said circuit board to said base, said via electrically connected to said first and said second wiring patterns.

45. The integrated substrate of claim 44, wherein said at least one thermal via comprises a plurality of vias.

46. The integrated substrate of claim 40, wherein said base is made of aluminum and said first and second wiring patterns are made of copper.

47. The integrated substrate of claim 40, wherein said second interconnect pattern forms a bottom surface of said cavity.

48. The integrated substrate of claim 40, wherein a heat spreader forms a bottom surface of said cavity, said heat spreader mounted to said base with said thermally conductive and electrically insulating bonding material.

49. The integrated substrate of claim 40, wherein said base forms a bottom surface of said cavity.

50. An integrated substrate having enhanced thermal properties comprising:
- a thermally conductive heatsink base;
- a multilayer printed circuit board having at least one control semiconductor element mounted to a top surface of said multilayer printed circuit board;
- a thermally conductive and electrically insulating bonding material which bonds said circuit board to said base;
- a cavity disposed in a top surface of said circuit board, a power semiconductor element mounted in said cavity;
- said circuit board including a first wiring pattern connected to the control semiconductor element;
- said circuit board including a second wiring pattern connected to the power semiconductor element, said second wiring pattern forming a bottom surface of said cavity; and
- said first wiring pattern electrically connected to said second wiring pattern.

51. The integrated substrate of claim 50, wherein said first wiring pattern has a thickness less than 0.002 inches.

52. The integrated substrate of claim 51, wherein said second wiring pattern has a thickness greater than 0.005 inches.

53. An integrated substrate having enhanced thermal properties comprising:
- a thermally conductive heatsink base;
- a multilayer printed circuit board having at least one control semiconductor element mounted thereto;
- a thermally conductive and electrically insulating bonding material which bonds said circuit board to said base;
- a cavity disposed in a top surface of said circuit board, a power semiconductor element mounted in said cavity;
- said circuit board including a first wiring pattern connected to the control semiconductor element, said first wiring pattern having a thickness less than 0.002 inches;
- said circuit board including a second wiring pattern connected to the power semiconductor element, said second wiring pattern having a thickness greater than 0.005 inches;
- said first wiring pattern electrically connected to said second wiring pattern.

* * * * *

UNITED STATES PATENT AND TRADEMARK OFFICE
CERTIFICATE OF CORRECTION

PATENT NO. : 6,201,701 B1
DATED : March 13, 2001
INVENTOR(S) : Rolf W. Linden et al.

It is certified that error appears in the above-identified patent and that said Letters Patent is hereby corrected as shown below:

Column 4,
Line 13, delete "prepared" and substitute therefor -- prepreg --.

Column 8,
Line 6, delete "prepared" and substitute therefor -- prepreg --.

Column 9,
Lines 13, 14, 17, 48, 51, and 60, delete "prepared" and substitute therefor -- prepreg --.

Column 11,
Lines 21, 22, 26, and 41, delete "prepared" and substitute therefor -- prepreg --.
Line 49, delete "prepare" and substitute therefor -- prepreg --.

Column 12,
Line 23, delete "prepare" and substitute therefor -- prepreg --.

Column 13,
Lines 21, and 49, delete "prepare" and substitute therefor -- prepreg --.

Column 17, claim 37,
Line 2, delete "prepare" and substitute therefor -- prepreg --.

Signed and Sealed this

Twenty-second Day of January, 2002

Attest:

*Attesting Officer*

JAMES E. ROGAN
*Director of the United States Patent and Trademark Office*